(12) United States Patent
Iskanius et al.

(10) Patent No.: US 11,215,649 B2
(45) Date of Patent: Jan. 4, 2022

(54) ELECTRIC POWER SYSTEM AND METHOD FOR MONITORING THE SAME

(71) Applicant: Danfoss Editron OY, Lappeenranta (FI)

(72) Inventors: Matti Iskanius, Nordborg (DK); Risto Tiainen, Nordborg (DK)

(73) Assignee: Danfoss Editron Oy, Lappeenranta (FI)

( * ) Notice: Subject to any disclaimer, the term of this patent is extended or adjusted under 35 U.S.C. 154(b) by 195 days.

(21) Appl. No.: 16/491,233

(22) PCT Filed: Mar. 13, 2018

(86) PCT No.: PCT/EP2018/056194
§ 371 (c)(1),
(2) Date: Sep. 5, 2019

(87) PCT Pub. No.: WO2018/172138
PCT Pub. Date: Sep. 27, 2018

(65) Prior Publication Data
US 2020/0011907 A1     Jan. 9, 2020

(30) Foreign Application Priority Data
Mar. 21, 2017  (EP) .................................... 17161993

(51) Int. Cl.
*G01R 19/25* (2006.01)
*G01R 31/08* (2020.01)
*H02J 13/00* (2006.01)

(52) U.S. Cl.
CPC ..... *G01R 19/2509* (2013.01); *G01R 19/2513* (2013.01); *G01R 31/088* (2013.01); *H02J 13/0096* (2013.01)

(58) Field of Classification Search
CPC ............ G01R 19/2509; G01R 19/2513; G01R 31/088; H02J 13/00002; H02J 13/0096; H02J 2310/42; H02J 4/00
(Continued)

(56) References Cited

U.S. PATENT DOCUMENTS

| 6,018,700 A * | 1/2000 | Edel .................... G01R 19/2513 |
| | | 361/18 |
| 9,453,869 B1 * | 9/2016 | Parkin .................... G01R 31/50 |

(Continued)

FOREIGN PATENT DOCUMENTS

| AU | 2009238183 A1 | 10/2009 |
| CN | 102947716 A | 2/2013 |

(Continued)

OTHER PUBLICATIONS

International Search Report for PCT Application No. PCT/EP2018/056194 dated May 14, 2018.

*Primary Examiner* — John H Le
(74) *Attorney, Agent, or Firm* — McCormick, Paulding & Huber PLLC

(57) ABSTRACT

An electric power system comprises recording devices (101-105) located at different elements of the electric power system and configured to record waveform samples of quantities related to operation of the elements of the electric power system. The electric power system comprises a central device (106) configured to receive the recorded waveform samples from the recording devices. The recording devices are synchronized to maintain a common clock time and to associate, to each of the recorded waveform samples, one or more timing values indicative of the clock time during recording the waveform sample. As the timing values are associated to the waveform samples, it is possible to reconstruct a time order of phenomena indicated by the recorded waveform samples. Thus, it is possible to identify (Continued)

which of the phenomena are causes and which are consequences when analyzing for example what happened prior to a fault situation.

29 Claims, 3 Drawing Sheets

(58) Field of Classification Search
USPC .......................................................... 702/58
See application file for complete search history.

(56) References Cited

U.S. PATENT DOCUMENTS

| | | |
|---|---|---|
| 2007/0279068 A1 | 12/2007 | Harres |
| 2008/0077336 A1 | 3/2008 | Fernandes |
| 2012/0063039 A1 | 3/2012 | Shah et al. |
| 2014/0328441 A1 | 11/2014 | Sagen |
| 2015/0331052 A1 | 11/2015 | Seeley et al. |
| 2016/0239010 A1* | 8/2016 | McDaniel ......... H02J 13/00034 |

FOREIGN PATENT DOCUMENTS

| | | |
|---|---|---|
| CN | 104200323 A | 12/2014 |
| CN | 105683766 A | 6/2016 |
| EP | 1 016 869 A3 | 12/2000 |
| WO | 2013056144 A1 | 4/2013 |

\* cited by examiner

ELECTRIC POWER SYSTEM AND METHOD FOR MONITORING THE SAME

CROSS-REFERENCE TO RELATED APPLICATIONS

This application is a National Stage application of International Patent Application No. PCT/EP2018/056194 filed on Mar. 13, 2018, which claims priority to European Patent Application No. 17161993.5 filed Mar. 21, 2017, each of which is hereby incorporated by reference in its entirety.

TECHNICAL FIELD

The disclosure relates to an electric power system comprising elements such as, for example but not necessarily, generators, electric machines, and power converters. Furthermore, the disclosure relates to a method for monitoring an electric power system.

BACKGROUND

In many cases, an electric power system comprises elements such as generators, electric machines, and power converters. Furthermore, an electric power system may comprise protector elements such as for example over-current protectors, over-voltage protectors, under-voltage protectors, and overheating protectors. For example, an over-current protector can be e.g. a fuse or a relay configured to break an electric circuit when current gets dangerously strong. For another example, an overheating protector may comprise one or more temperature sensors and a relay configured to switch off power supply when one or more measured temperatures get dangerously high.

After a fault or another problem has occurred in an electric power system, it can be important to analyze the problem in order to see how the electric power system should be modified and/or used so that similar problems can be avoided in the future. In order to provide data for the analysis, an electric power system can be provided with recording devices which are located at different elements of the electric power system and which are configured to record waveform samples of quantities related to the operation of these elements. The quantities may comprise for example currents, voltages, and/or temperatures measured from the elements of the electric power system. The electric power system may further comprise a central device communicatively connected to the recording devices and configured to receive the recorded waveform samples from the recording devices. The recorded waveform samples may serve as analysis data based on which the operation of the electric power system prior to an occurrence of a fault or another problem can be analyzed. For example, recorded waveform samples of currents and voltages may reveal that a fault was preceded by sudden drops in particular voltages and/or sudden increases in particular currents. In many situations, it can be however challenging to identify which of phenomena, such as e.g. abrupt changes in currents and/or voltages, indicated by recorded waveform samples are causes and which of the phenomena are, in turn, consequences.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electric power system that can be, for example, but not necessarily an electric power system of a building, a land vehicle, a vessel such as a ship, an aircraft, or a working machine. It is also possible that the electric power system is a power distribution grid.

An electric power system according to the invention comprises:
  recording devices located at different elements of the electric power system and configured to record waveform samples of quantities related to the operation of the elements of the electric power system, and
  a central device communicatively connected to the recording devices and configured to receive the recorded waveform samples from the recording devices.

The recording devices are synchronized with respect to each other to maintain a clock time that is common to the recording devices. Furthermore, the recording devices are configured to associate, to each of the recorded waveform samples, one or more timing values indicative of the clock time during recording the waveform sample under consideration. The central device which is configured to receive the recorded waveform samples provided with the timing values can be a separate device with respect to the recording devices, or the central device and one of the recording devices can be implemented as a single apparatus.

As the timing values are associated to the waveform samples, it is possible to identify the temporal order of phenomena, such as e.g. abrupt changes in currents and/or voltages, indicated by the recorded waveform samples. Thus, it is possible to identify which of the phenomena are causes and which are, in turn, consequences when analyzing for example what happened prior to a fault situation.

In accordance with the invention, there is provided also a new method for monitoring an electric power system. A method according to the invention comprises:
  recording, at different elements of the electric power system, waveform samples of quantities related to the operation of the elements of the electric power system,
  maintaining a clock time that is available when recording the waveform samples at the elements of the electric power system, and
  associating, to each of the recorded waveform samples, one or more timing values indicative of the clock time during recording the waveform sample under consideration.

A method according to an exemplifying and non-limiting embodiment of the invention further comprises identifying, based on the timing values associated to the recorded waveform samples, the temporal order of phenomena indicated by the recorded waveform samples.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of un-recited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below in the sense of examples and with reference to the accompanying drawings, in which.

DETAILED DESCRIPTION

The specific examples provided in the description below should not be construed as limiting the scope and/or the applicability of the accompanied claims. Lists and groups of examples provided in the description are not exhaustive unless otherwise explicitly stated.

Figure 1A:
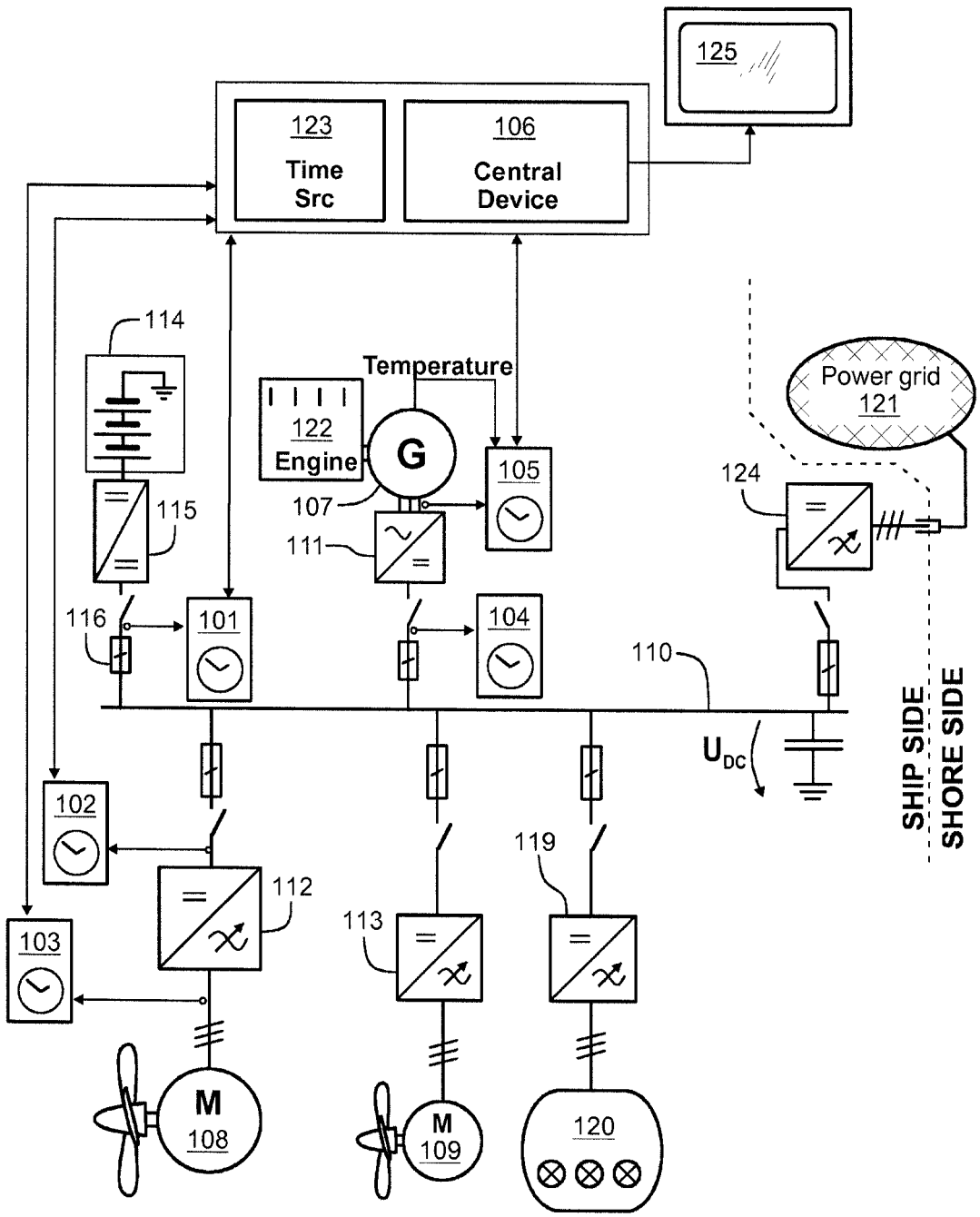
FIGS. 1a and 1b illustrate an electric power system according to an exemplifying and non-limiting embodiment of the invention.

FIG 1a shows a schematic illustration of an electric power system according to an exemplifying and non-limiting embodiment of the invention. In this exemplifying case, the electric power system is a part of an electric system of a ship or a ferry. The electric power system comprises a generator 107 driven with a combustion engine 122 that can be for example a diesel engine. The electric power system comprises electric machines 108 and 109 for driving actuators. In this exemplifying case, the actuators are propellers. Furthermore, the electric power system may comprise e.g. a lighting system 120. The electric power system comprises a power control system for transferring electric power from the generator 107 to the electric machines 108 and 109 and to other power consuming loads of the electric power system. In this exemplifying case, the power control system comprises a direct voltage rail 110, a first power converter 111 for transferring electric energy from the generator 107 to the direct voltage rail 110, and second power converters 112 and 113 for converting the direct voltage $U_{DC}$ of the direct voltage rail 110 into voltages suitable for the electric machines 108 and 109. The power control system further comprises a battery element 114 and a third power converter 115 for transferring electric energy between the direct voltage rail 110 and the battery element 114. Furthermore, the power control system comprises a power converter 119 for converting the direct voltage $U_{DC}$ of the direct voltage rail 110 into voltages suitable for the lighting system 120, and a power converter 124 for receiving electric power from a shore-side power distribution grid 121.

Figure 1B:
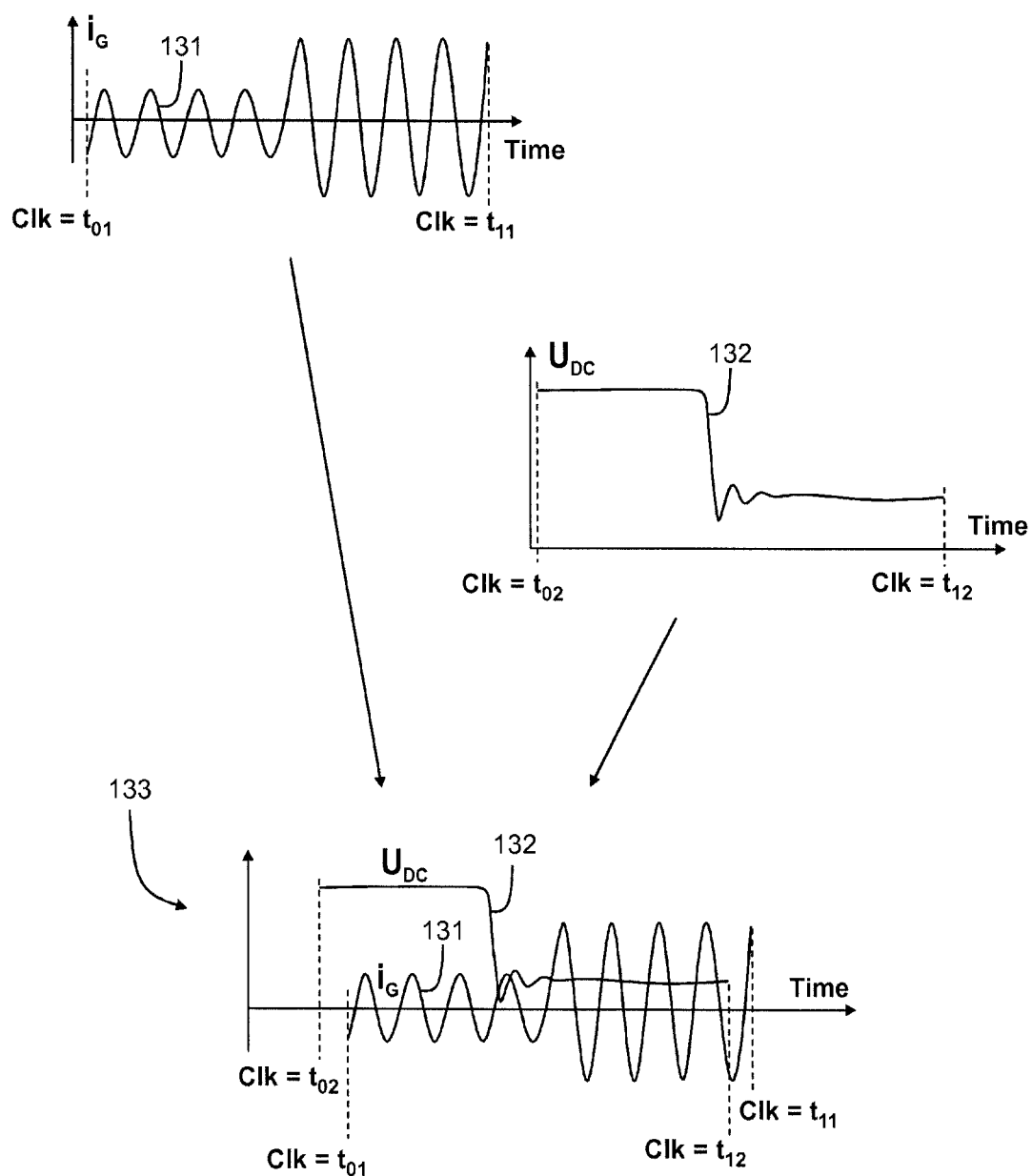

The electric power system comprises recording devices 101, 102, 103, 104, and 105 located at different sites of the electric power system and configured to record waveform samples of quantities related to operation of elements of the electric power system. The quantities may comprise for example currents, voltages, and/or temperatures measured from the elements of the electric power system. FIG. 1b shows an exemplifying waveform sample 131 of the current $i_G$ of one phase of the generator 107 and an exemplifying waveform sample 132 of the direct voltage $U_{DC}$ of the direct voltage rail 110. The electric power system comprises a central device 106 which is communicatively connected to the recording devices 101-105 and which is configured to receive the recorded waveform samples from the recording devices. The recording devices 101-105 are synchronized with respect to each other to maintain a clock time that is common to the recording devices 101-105. The recording devices are configured to associate, to each of the recorded waveform samples, one or more timing values indicative of the clock time during recording the waveform sample under consideration. In the exemplifying case illustrated in FIG. 1b, the timing values $t_{01}$ and $t_{11}$ corresponding to the beginning and the end of the waveform sample 131 are associated to the waveform sample 131. Correspondingly, the timing values $t_{02}$ and $t_{12}$ corresponding to the beginning and the end of the waveform sample 132 are associated to the waveform sample 132.

As the timing values are associated to the waveform samples, it is possible to identify the temporal order of phenomena, such as e.g. abrupt changes in currents and/or voltages, indicated by the recorded waveform samples. Thus, it is possible to identify which of the phenomena are causes and which are, in turn, consequences when analyzing for example what happened prior to a fault situation. A part 133 of FIG. 1b shows the exemplifying waveform samples 131 and 132 on a same time axis. The positions of the waveform samples 131 and 132 on the time axis can be determined with the aid of the timing values $t_{01}$, $t_{11}$, $t_{02}$, and $t_{12}$. In this exemplifying case, one can see that the drop in the direct voltage $U_{DC}$ of the direct voltage rail 110 takes place prior to the sudden increase in the generator current $i_G$.

In an electric power system according to an exemplifying and non-limiting embodiment of the invention, the central device 106 is configured to control, based on the timing values associated to the recorded waveform samples, a display screen 125 to display the recorded waveform samples on a same time axis. The display screen 125 can be controlled to display the recorded waveform samples for example in the way illustrated in the part 133 of FIG. 1b.

In an electric power system according to an exemplifying and non-limiting embodiment of the invention, the recording devices 101-105 are configured to record the waveform samples according to a continuous loop recording mode where new data is recorded by overwriting corresponding old data which has been recorded a predetermined amount of time earlier. The predetermined amount of time corresponds to the temporal length of a recorded waveform sample.

In an electric power system according to an exemplifying and non-limiting embodiment of the invention, one or more of the recording devices 101-105 are configured to detect one or more predefined events which may occur within the electric power system. Furthermore, the one or more of the recording devices 101-105 can be configured to send, to the central device 106, an event indicator identifying a detected event and expressing the clock time at a moment of detection of the event. In exemplifying cases where the waveform samples are recorded according to the above-mentioned continuous loop recording mode, the recording of each waveform sample can be continued after a detected event for a predetermined time period that is shorter than the temporal length of the recorded waveform sample. Thus, each recorded waveform sample contains a first portion recorded prior to the detected event as well as a second portion recorded after the detected event.

The events capable of being detected may comprise for example an activation of an over-current protector e.g. a blowout of a fuse, an activation of an over-voltage protector, an activation of an under-voltage protector, and/or an activation of an overheating protector. For example, the recording device 101 can be configured to detect a blowout of a fuse 116 and/or to detect over- and under-voltage situations which may take place on the direct voltage rail 110. For another example, the recording device 105 can be configured to detect over-current situations of the generator 107 and/or to detect over- and under-voltage situations of the generator 107 and/or to detect overheating situations of the generator 107.

In an electric power system according to an exemplifying and non-limiting embodiment of the invention, the recording devices 101-105 comprise processors for maintaining the common clock time in accordance with a timing signal received from a timing source 123. It is also possible that one of the recording devices 101-105 is a master device that acts as a timing source and the other recording devices synchronize themselves with the master device. The recording devices 101-105 can be configured to communicate with the timing source 123 and/or with each other in accordance with a packet switched communication protocol. The packet switched communication protocol can be for example the Internet Protocol "IP", the Ethernet protocol, or some other suitable packet switched communication protocol. The processors of the recording devices 101-105 can be configured to maintain the clock time in accordance with a timing protocol suitable for packet switched data networks. The timing protocol can be for example the IEEE 1588 time distribution protocol where "IEEE" is the acronym of the Institute of Electrical and Electronics Engineers.

The central device 106 and the recording devices 101-105 can be implemented with appropriate sensors and with processor circuits each of which can be a programmable processor circuit provided with appropriate software, a dedicated hardware processor such as for example an application specific integrated circuit "ASIC", or a configurable hardware processor such as for example a field programmable gate array "FPGA". It is also possible that the central device 106 and/or the recording devices 101-105 are parts of the power converters 115, 112, and/or 111.

Figure 2:
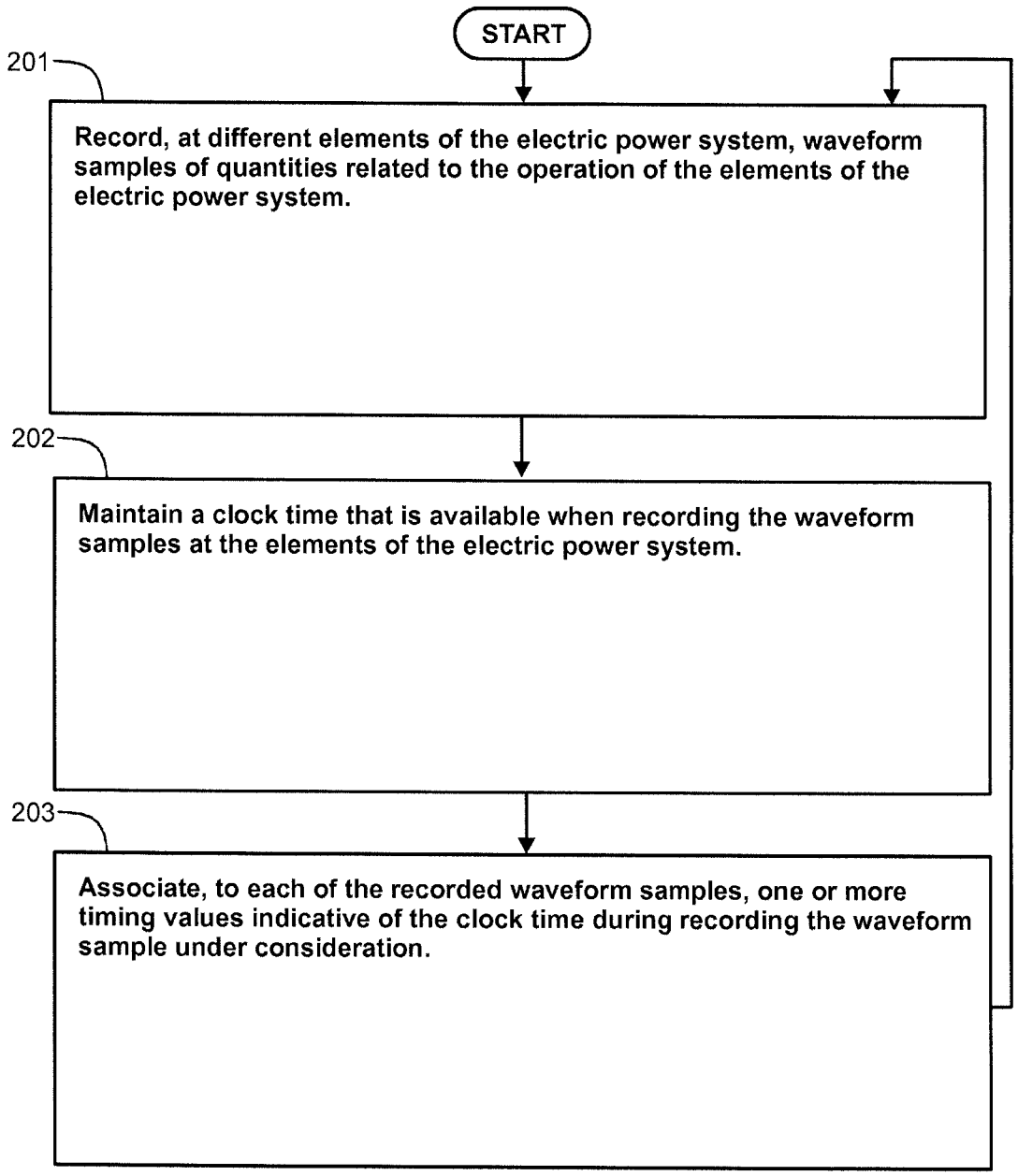
FIG. 2 is a flowchart of a method according to an exemplifying and non-limiting embodiment of the invention for monitoring an electric power system.

FIG. 2 shows a flowchart of a method according to an exemplifying and non-limiting embodiment of the invention for monitoring an electric power system. The method comprises the following actions:
- action 201: recording, at different elements of the electric power system, waveform samples of quantities related to operation of the elements of the electric power system,
- action 202: maintaining a common clock time that is available when recording the waveform samples at the elements of the electric power system, and
- action 203: associating, to each of the recorded waveform samples, one or more timing values indicative of the clock time during recording the waveform sample under consideration.

A method according to an exemplifying and non-limiting embodiment of the invention comprises identifying, based on the timing values associated to the recorded waveform samples, a temporal order of phenomena indicated by the recorded waveform samples.

A method according to an exemplifying and non-limiting embodiment of the invention comprises controlling, based on the timing values associated to the recorded waveform samples, a display screen to display the recorded waveform samples on a same time axis.

A method according to an exemplifying and non-limiting embodiment of the invention comprises recording the waveform samples according to a loop recording mode where new data is recorded by overwriting corresponding old data recorded a predetermined amount of time earlier.

A method according to an exemplifying and non-limiting embodiment of the invention comprises detecting whether any of one or more predefined events takes place within the electric power system. The method may further comprise sending, to a central device, an event indicator identifying a detected event and expressing the clock time at a moment of detection of the event. In exemplifying cases where the waveform samples are recorded according to the above-mentioned loop recording mode, the recording of each waveform sample can be continued after the detected event for a predetermined time period that is shorter than the temporal length of the recorded waveform sample. A method according to an exemplifying and non-limiting embodiment of the invention comprises detecting an activation of an over-current protector of the electric power system. A method according to an exemplifying and non-limiting embodiment of the invention comprises detecting an activation of an over-voltage protector of the electric power system. A method according to an exemplifying and non-limiting embodiment of the invention comprises detecting an activation of an under-voltage protector of the electric power system. A method according to an exemplifying and non-limiting embodiment of the invention comprises detecting an activation of an overheating protector of the electric power system.

A method according to an exemplifying and non-limiting embodiment of the invention comprises maintaining the above-mentioned clock time in accordance with a timing signal received from a timing source. A method according to an exemplifying and non-limiting embodiment of the invention comprises maintaining the clock time in accordance with a timing protocol suitable for packet switched data networks.

In a method according to an exemplifying and non-limiting embodiment of the invention, the electric power system comprises one or more generators, one or more electric machines for driving actuators, and a power control system for transferring electric power from the one or more generators to the one or more electric machines.

In a method according to an exemplifying and non-limiting embodiment of the invention, the above-mentioned power control system comprises a direct voltage rail, one or more first power converters for transferring electric energy from the one or more generators to the direct voltage rail, and one or more second power converters for converting direct voltage of the direct voltage rail into voltages suitable for the one or more electric machines. In a method according to an exemplifying and non-limiting embodiment of the invention, the above-mentioned power control system comprises one or more battery elements and one or more third power converters for transferring electric energy between the direct voltage rail and the one or more battery elements.

The specific examples provided in the description given above should not be construed as limiting the scope and/or the applicability of the appended claims. Lists and groups of examples provided in the description given above are not exhaustive unless otherwise explicitly stated.

What is claimed is:
1. An electric power system comprising:
recording devices located at different elements of the electric power system and configured to record waveform samples of quantities related to operation of the elements of the electric power system, and a central device communicatively connected to the recording devices and configured to receive the recorded waveform samples from the recording devices, wherein:
the recording devices are synchronized with respect to each other to maintain a clock time common to the recording devices, and
the recording devices are configured to associate, to each of the recorded waveform samples, one or more timing values indicative of the clock time during recording the waveform sample under consideration, the one or more timing values are only timing values corresponding to the beginning and the end of the recorded waveform sample.

2. The electric power system according to claim 1, wherein the central device is configured to control, based on the timing values associated to the recorded waveform samples, a display screen to display the recorded waveform samples on a same time axis.

3. The electric power system according to claim 1, wherein the recording devices are configured to record the waveform samples according to a loop recording mode where new data is recorded by overwriting corresponding old data recorded a predetermined amount of time earlier.

4. The electric power system according to claim 3, wherein:
one or more of the recording devices are configured to detect one or more predefined events capable of occurring within the electric power system, and
the recording devices are configured to continue, after detection of one of predefined events, recordings of the waveform samples for a time period shorter than the predetermined amount of time and to stop the recordings after the time period.

5. The electric power system according to claim 4, wherein the one or more of the recording devices are configured to detect an activation of an over-current protector of the electric power system.

6. The electric power system according to claim 4, wherein the one or more of the recording devices are configured to detect an activation of an over-voltage protector of the electric power system.

7. The electric power system according to claim 4, wherein the one or more of the recording devices are configured to detect an activation of an under-voltage protector of the electric power system.

8. The electric power system according to claim 4, wherein the one or more of the recording devices are configured to detect an activation of an overheating protector of the electric power system.

9. The electric power system according to claim 1, wherein one or more of the recording devices are configured to detect one or more predefined events capable of occurring within the electric power system and to send, to the central device, an event indicator identifying a detected one of the predefined events and expressing the clock time at a moment of detection of the detected one of the predefined events.

10. The electric power system according to claim 1, wherein the recording devices comprise processors for maintaining the clock time in accordance with a timing signal received from a timing source.

11. The electric power system according to claim 10, wherein the recording devices are configured to communicate with the timing source in accordance with a packet switched communication protocol and the processors of the recording devices are configured to maintain the clock time in accordance with a timing protocol suitable for packet switched data networks.

12. The electric power system according to claim 1, wherein the electric power system comprises one or more generators, one or more electric machines for driving actuators, and a power control system for transferring electric power from the one or more generators to the one or more electric machines.

13. The electric power system according to claim 12, wherein the power control system comprises a direct voltage rail, one or more first power converters for transferring electric energy from the one or more generators to the direct voltage rail, and one or more second power converters for converting direct voltage of the direct voltage rail into voltages suitable for the one or more electric machines.

14. A method for monitoring an electric power system, the method comprising:
recording, at different elements of the electric power system, waveform samples of quantities related to operation of the elements of the electric power system, wherein the method further comprises:
maintaining a clock time that is available when recording the waveform samples at the elements of the electric power system, and
associating, to each of the recorded waveform samples, one or more timing values indicative of the clock time during recording the waveform sample under consideration, the one or more timing values are only timing values corresponding to the beginning and the end of the recorded waveform sample.

15. The method according to claim 14, wherein the method comprises identifying, based on the timing values associated to the recorded waveform samples, a temporal order of phenomena indicated by the recorded waveform samples.

16. The method according to claim 14, wherein the method comprises controlling, based on the timing values associated to the recorded waveform samples, a display screen to display the recorded waveform samples on a same time axis.

17. The method according to claim 14, wherein the method comprises recording the waveform samples according to a loop recording mode where new data is recorded by overwriting corresponding old data recorded a predetermined amount of time earlier.

18. The method according to claim 14, wherein the method comprises detecting whether any of one or more predefined events takes place within the electric power system.

19. The method according to claim 18, wherein the method comprises sending, to a central device, an event indicator identifying a detected event and expressing the clock time at a moment of detection of the event.

20. The method according to claim 18, wherein the waveform samples are recorded according to a loop recording mode where new data is recorded by overwriting corresponding old data recorded a predetermined amount of time earlier, and the recording of each waveform sample is continued after the detected event for a predetermined time period that is shorter than a temporal length of the recorded waveform sample.

21. The method according to claim 14, wherein the method comprises detecting an activation of an over-current protector of the electric power system.

22. The method according to claim 14, wherein the method comprises detecting an activation of an over-voltage protector of the electric power system.

23. The method according to claim 14, wherein the method comprises detecting an activation of an under-voltage protector of the electric power system.

24. The method according claim 14, wherein the method comprises detecting an activation of an overheating protector of the electric power system.

25. The method according to claim 14, wherein the method comprises maintaining the above-mentioned clock time in accordance with a timing signal received from a timing source.

26. The method according to claim 14, wherein the method comprises maintaining the clock time in accordance with a timing protocol suitable for packet switched data networks.

27. The method according to claim 14, wherein the electric power system comprises one or more generators, one or more electric machines for driving actuators, and a power control system for transferring electric power from the one or more generators to the one or more electric machines.

28. The method according to claim 27, wherein the power control system comprises a direct voltage rail, one or more first power converters for transferring electric energy from the one or more generators to the direct voltage rail, and one or more second power converters for converting direct voltage of the direct voltage rail into voltages suitable for the one or more electric machines.

29. The method according to claim 28, wherein the power control system comprises one or more battery elements and one or more third power converters for transferring electric energy between the direct voltage rail and the one or more battery elements.

* * * * *